United States Patent [19]
Van Overbeek

[11] Patent Number: 5,577,127
[45] Date of Patent: Nov. 19, 1996

[54] SYSTEM FOR RAPID CONVERGENCE OF AN ADAPTIVE FILTER IN THE GENERATION OF A TIME VARIANT SIGNAL FOR CANCELLATION OF A PRIMARY SIGNAL

[75] Inventor: Michiel W. R. M. Van Overbeek, Dordrecht, Netherlands

[73] Assignee: Nederlandse Organisatie Voor Toegepast-Natuurwetenschappelijk Onderzoek Tno, Delft, Netherlands

[21] Appl. No.: 344,588

[22] Filed: Nov. 18, 1994

[30] Foreign Application Priority Data

Nov. 19, 1993 [NL] Netherlands ............................ 9302013

[51] Int. Cl.$^6$ ........................ H03B 29/00; A61F 11/06; H04B 15/00
[52] U.S. Cl. ............................................. 381/71; 381/94
[58] Field of Search ................................ 381/71, 94, 73.1

[56] References Cited

U.S. PATENT DOCUMENTS

| | | | |
|---|---|---|---|
| 4,815,139 | 3/1989 | Eriksson et al. | 381/71 |
| 4,878,188 | 10/1989 | Ziegler, Jr. | 281/71 |
| 5,170,433 | 12/1992 | Elliott et al. | 381/71 |
| 5,278,913 | 1/1994 | Delfosse et al. | 381/71 |
| 5,396,561 | 3/1995 | Popovich et al. | 381/71 |
| 5,416,845 | 5/1995 | Shen | 381/71 |
| 5,428,562 | 6/1995 | Gay | 379/406 |

FOREIGN PATENT DOCUMENTS

WO93/15501  8/1993  WIPO.

OTHER PUBLICATIONS by Hong Fan et al., "Robust Adaptive Algorithms for Active Noise and Vibration Control", *1990 IEEE*, Albuquerque, Apr. 1990, pp. 1137–1140.

*Primary Examiner*—Forester W. Isen
*Assistant Examiner*—Xu Mei
*Attorney, Agent, or Firm*—Young & Thompson

[57] ABSTRACT

System for generating a secondary signal ($y_s(k)$) for suppression of a primary signal ($y_p(k)$), having:

means (8) for generating a reference signal ($\bar{\phi}(k)$):
a control unit (1) having a digital filter for providing a cancellation control signal (s(k));
cancellation-generating means (2) for generating a secondary signal ($y_s(k)$);
sensor means (4) for providing an error signal ($\epsilon(k)$),
update means (5) for providing an update signal ($\overline{up}(k)$);
an adaptation unit (7) for supplying a filtered-x signal ($\bar{r}(k)$) to the update means (5);
means for updating filter coefficients ($\theta_{c,v}(k)$) of the filter in the control unit (1) with the aid of the so-called "projection algorithm" and
the various features being such that an input correlation matrix defined according to equation 17 has an eigenvalue distribution which has a value which is at least substantially identical to 1 after as few steps as possible.

11 Claims, 1 Drawing Sheet

SYSTEM FOR RAPID CONVERGENCE OF AN ADAPTIVE FILTER IN THE GENERATION OF A TIME VARIANT SIGNAL FOR CANCELLATION OF A PRIMARY SIGNAL

BACKGROUND OF THE INVENTION

1. Field of the Invention

The invention relates to a system for the generation of an estimated time variant signal for suppression of a primary signal, comprising:

means for generating at least one reference signal;

a control unit at least provided with a digital filter, a first input for receiving the reference signal, a second input for receiving an update signal for updating coefficients of the digital filter and an output for providing a cancellation control signal;

cancellation-generating means which are connected to the output of the control unit for the generation of a cancellation signal, which is intended, after propagation along a secondary transfer path having a secondary path transfer function, to be added as the estimated time variant signal at an addition point to the primary signal in order to provide a residual signal, sensor means for measuring the residual signal at the addition point and for providing an error signal;

update means provided with an input which is connected to the sensor means and an output for providing the update signal.

2. Discussion of the Related Art

A system of this type is disclosed in U.S. Pat. No. 4,878,188.

The known system can be used, inter alia, to cancel out irritant noise (the primary signal) from a rotary machine and comprises means for generating a reference signal, which means, for example, comprise a tachometer of a rotary machine or an optical sensor for measuring the speed of revolution of the rotary machine. In addition, the known system comprises a signal processor for generating a cancellation control signal, which is supplied to cancellation signal-generating means for generating a cancellation signal, which as far as possible has to cancel out the primary signal within a specific area. The residual signal in that area is measured using suitable sensor means, the output signal from which is fed to update means. The latter means produce an update signal for the signal-processing means in order to update the filter coefficients of an adaptive filter present therein. The update signal is derived form the residual signal and can, for example, be determined with the aid of the least mean squares (LMS) method and is aimed at causing the residual signal to become as small as possible.

In the system according to the US Patent, in the case of a multi-channel embodiment, the reference signal is supplied via n base reference signals on n parallel branches to the signal-processing means. Each base reference signal is fed to a cosine generator and a sine generator. The cosine generator produces a base cosine signal with a specific base frequency and a number of higher harmonics thereof. The sine generator produces a base sine signal with a specific base frequency and a number of higher harmonics thereof. All cosine and sine signals are multiplied by suitable filter coefficients of the adaptive filter. Phase means are used to ensure that the adaptation of the filter coefficients takes place in such a way that the filter characteristics remain within 90° of the primary signal. A summation unit finally adds together all cosine and sine signals modified in this way in order to generate the cancellation control signal.

The convergence speed of the algorithms used in the prior art is found to be moderate for various types of primary signals, for example for rapidly changing periodic signals which, for example, arise in the exhaust of a car, and for pulse-like signals. In this context the convergence speed is defined as the speed with which a control system used proceeds to the state of as complete as possible noise suppression. The convergence speed of the known algorithms is found not to be optimum in multi-channel systems as well.

SUMMARY OF THE INVENTION

One objective of the invention is to provide a system and a method with which the speed of convergence of the algorithm used is increased compared with the prior art.

To this end, a system of the type mentioned in the preamble is characterised in that the system also comprises an adaptation unit which has an input for receiving the at least one reference signal and an output for providing a filtered-x signal, which output is connected to a further input of the update means;

the adaptation unit has a transfer function which is the same as the transfer function of the secondary path;

means are provided for updating the filter coefficients with the aid of the so-called "projection algorithm" and the means for generating the reference signal generate the reference signal in such way that an input correlation matrix defined as follows $$\sum_{k=1}^{n} \frac{\bar{r}(k)\bar{r}^H(k)}{\bar{r}^H(k)\bar{r}(k)}$$

has an eigenvalue distribution which has a value which is substantially equal to 1 after as few steps as possible.

As a result of the use of a combination of a projection algorithm and the selection of the reference signal in the manner described above, in practice a more rapid convergence is achieved than is possible according to the prior art.

Preferably, the system according to the invention is a multi-channel system, that is to say a system in which the cancellation-generating means comprise various cancellation-generating units and the sensor means comprise various sensor units, the control unit being provided with means for updating coefficients of the digital filter in accordance with the following recursive relationship:

$$\bar{\theta}_{c,v}(k) = \bar{\theta}_{c,v}(k-1) - \gamma [R_v(k) R_v^H(k)]^{-1} R_v(k) \bar{\epsilon}(k)$$

where:

$\bar{\theta}_{c,v}(k)$ is an L-dimensional filter coefficient vector when L cancellation signal generators are present;

$\gamma$=step size parameter;

$R_v(k)$ is an LxM matrix which contains input signals $r_{v,l,m}(k)$ as elements when M sensors are present;

$\bar{\epsilon}(k)$=error signal vector with M elements originating from the M sensors.

In an embodiment for a single channel system, the system according to the invention is characterised in that the means for generating the reference signal are equipped to generate the following reference signal:

$$\bar{\phi}_f(k) = [\phi_1(k) \phi_2(k) \ldots \phi_f(k)]^T$$

where:

$$\phi_v(k) = exp(j2\pi f_v k\Delta t)$$

the update unit is provided with means for calculating the update signal as follows:

$$up_v(k) = \gamma \frac{r_v(k)\epsilon(k)}{(\alpha' + r_v^*(k)r_v(k))}$$

where:
γ=step size
α'=small constant to prevent division by 0;
the control unit is provided with means for calculating the filter coefficients as follows:

$$\theta_{c,v}(k) = \theta_{c,v}(k-1) - up_v(k)$$

The system according to the invention can also comprise estimating means for estimating the transfer function of the secondary path, which means have an input connected to the sensor means and an output connected to the adaptation unit for transmitting an output signal for updating of the transfer function used in the adaptation unit.

The control unit, the update means and the adaptation unit, and the estimating means which are optionally used, can be implemented together in the software of a computer.

The cancellation-generating means can be selected form the following means:

at least one loudspeaker, at least one vibration generator, at least one adjustable flow-induced noise source or a combination thereof, and the sensor means can be selected from the following means:

at least one noise pressure sensor, at least one vibration recorder or a combination thereof.

BRIEF DESCRIPTION OF THE DRAWINGS

The invention will be explained in more detail below with reference to a few illustrative embodiments, which are intended to illustrate the principle of the invention and not to imply any restriction thereof.

DETAILED DESCRIPTION OF THE EMBODIMENTS

The following is known from mathematics. Assume there is a primary function P(n):

$$P(n) = \sum_{i=1}^{I} a_i(n) \cdot f_i(x_n) \qquad (1)$$

where:
$a_i(n)$=multiplication coefficient
$F_i(x_n)$ a known function having a variable $x_n$
I–1, 2, 3, . . . , I where I has a predetermined value.
A number of conditions must be met if it is desired to calculate the various $a_i(n)$ from a number of measurements of $x_n$. The first condition is that: I <n and the second that the various $a_i(n)$ must be stationary. The various $a_i(n)$ can then be calculated using the least squares method. The number of steps needed for this is equal to the number of coefficients $a_i(n)$.

However, if P is contaminated with noise, the least squares method can then not be used. Provided the other two abovementioned conditions are met, the least squares error method can then be used. Furthermore, large matrices can sometimes occur in the calculations, which matrices impose a heavy burden on the computing time of a computer used, and the primary function P(n) is far from being always available, as in anti-noise systems. If this is the case, the recursive least squares error method could be used. If the coefficients $a_i(n)$ are themselves not time-invariant, the least squares method can not be used at all.

Should P be contaminated with noise, should a particularly large matrix occur in the calculation and should the coefficients $a_i(n)$ themselves not be timeinvariant, the so-called "projection algorithm" can then be used successfully, as is known per se from mathematics. By using a projection algorithm together with orthogonal functions, the I coefficients $a_i(n)$ can even be estimated in n steps. A direct application of a projection algorithm with orthogonal functions in a system for the production of, for example, anti-noise is not possible without the necessary adjustments because the path traversed by the anti-noise (the "secondary path") introduces phase shifts and time delays. Furthermore, in general, orthogonal functions are not supplied to the system. The necessary adjustments to a projection algorithm with orthogonal functions for, for example, an anti-noise system will be explained below. It will be seen from this explanation that, in practice, the definition of orthogonal functions frequently takes up too much computing time and an approximation of the ideal state—that is to say the use of a projection algorithm with orthogonal functions—is to be preferred.

Figure 1:
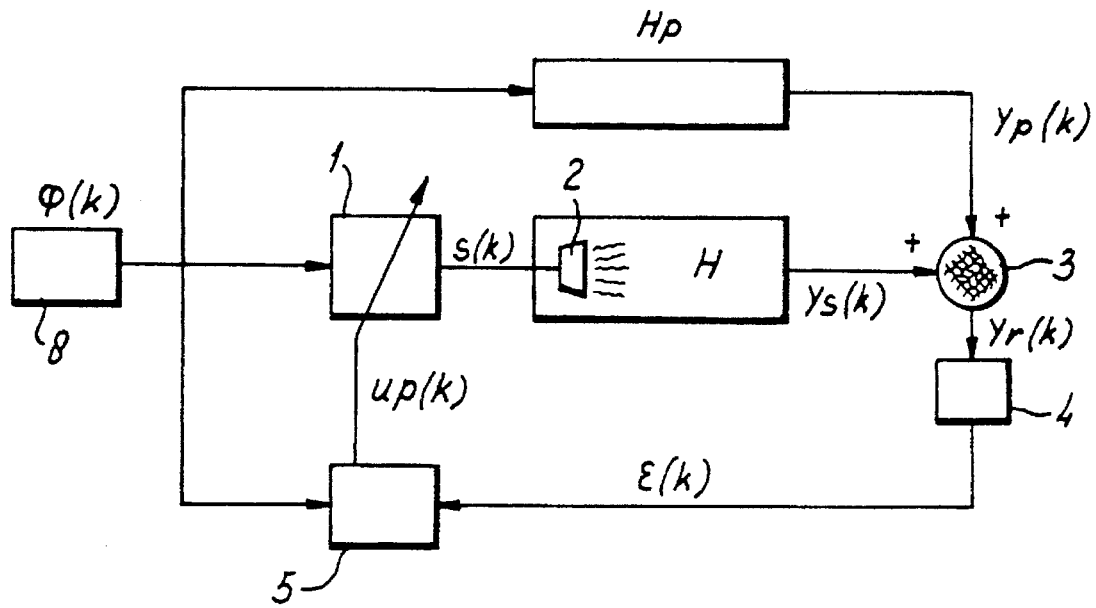
FIG. 1 shows a block diagram of a known anti noise system.

FIG. 1 shows a known model of an anti-noise system. A reference signal φ(k) is generated by a reference signal generator 8 and is fed to a control unit 1, which calculates a cancellation control signal s(k). The cancellation control signal is fed via suitable connecting means to a cancellation signal generator 2, which generates a cancellation signal which, after passing over a secondary path with transfer function H arrives as process output signal $y_s(k)$ in a specific area 3, where it has to cancel out a primary signal $y_p(k)$ by means of addition. The signal resulting after addition—the residual signal $y_r(k)$—is detected with the aid of a sensor 4, which feeds an output signal ε(k) to update means 5. The update means 5 also receive the reference signal φ(k) and produce an update signal up(k), which is fed to the control unit 1, where it is used to update the filter coefficients of a filter used.

In a multi-channel system there are various cancellation signal generators 2 and various sensors 4.

The primary signal $y_p(k)$ can be modelled as a derivative of the reference signal φ(k), the latter signal traversing a primary path with primary transfer function $H_p$. If it is assumed that the reference signal φ(k) can be represented with sufficient accuracy by N frequency components, then φ(k) can be represented as a single reference signal in the complex plane as follows:

$$\phi(k) = \sum_{v=1}^{N} exp(j2\pi f_v k\Delta t) \qquad (2)$$

where:
φ(k)=reference signal at time kΔt
$f_v$=a frequency component
The primary signal $y_p(k)$ will have traversed the primary path before it has arrived at point 3. If it is now possible to use a finite impulse response of length I for a primary process associated with the primary path and for the control unit 1, then both the primary signal $y_p(k)$ and the cancellation control signal $s(k)$ can be represented as linear combinations of successive signals $\phi(k), \phi(k-1) \ldots \phi(k-I+1)$. The input elements can be collected in a time vector $\overline{\phi}_t(k)$:

$$\overline{\phi}_t(k) = [\phi(k)\phi(k-1) \ldots \phi(k-I+1)]^T \tag{3}$$

The filter based on a finite impulse response which is used in the control unit 1 is usually termed a transversal filter.

The reference signals can also be defined differently. Specifically, independent wave form generators can be used in order to generate various reference signals. The input signals for the primary process with transfer function $H_p$ and the control unit are then multidimensional. If it is assumed that the primary signal comprises I frequency components $v=1, \ldots I$, then the primary signal $y_p(k)$ and the cancellation control signal $s(k)$ comprise a linear combination with complex coefficients of the following time functions in the complex plane:

$$\phi_v(k) = exp(j2\pi f_v k \Delta t) \tag{4}$$

which are the functions on which a Fourier transform can be based. The complex coefficients are then Fourier coefficients. The input elements can thus also be modelled as a "Fourier vector":

$$\overline{\phi}_f(k) = [\phi_1(k)\phi_2(k) \ldots \phi_I(k)]^T \tag{5}$$

A control unit which is based on equation (5) can be termed a Fourier control unit.

If it is to be possible to apply the abovementioned projection algorithm with orthogonal functions, two successive reference vectors according to equation (3) or (5) (that is to say for, for example, k=j and k=j+1) will always have to be orthogonal. For an algorithm which is based on reference signals which are defined according to equation (3) it is virtually never possible to make successive time vectors $\overline{\phi}_t(k)$ orthogonal. In principle, this is possible for two successive Fourier vectors $\overline{\phi}_f(k)$ as defined in equation (5). However, in practice this takes a very great deal of computing time and would not serve the aim of rapid convergence. The latter is particularly true if the orthogonalisation is carried out in the known "filtered-x" least mean squares algorithm (for details on this see: B. Widrow and S.D. Stearns, "Adaptive Signal Processing", Englewood Cliffs, Prentice Hall, 1985; S.J. Elliott, I.M. Stothers and P.A. Nelson, "A multiple error LMS algorithm and its application to the active control of sound and vibration", *IEEE Trans. Acoust., Speech, Signal Processing*, Vol. ASSP 35, pp. 1423–1434, Oct. 1987; and L.J. Eriksson, M.C. Allie and R.A. Greiner, "The selection and application of an IIR adaptive filter for use in active sound attenuation", *IEEE Trans. Acoust., Speech, Signal Processing*, Vol. ASSP 35, pp. 433–437, Apr. 1987).

The problem of too long a computing time can be avoided by selecting or modifying the reference vectors in such a way that the eigenvalue distribution of an input correlation matrix for the update means 5 has become substantially equal to 1 after as few steps as possible, which steps are needed to calculate the filter coefficients of the filter present in the control unit, even though this will take place in more steps than is the case with an orthogonal system of reference vectors. This will be explained in more detail below.

For a series of reference vectors $\overline{\phi}_t(k)(k=1, 2, \ldots)$, as defined in equation (3), an eigenvalue distribution of this type is usually found to be far from optimum. This is frequently still true after thousands of steps of the algorithm used. However, it is found that if equation (5) and the series of reference vectors $\overline{\phi}_f(k)(k=1, 2, \ldots)$ as defined in equation (4) are used, the eigenvalue distribution of the autocorrelation matrix is already equal to 1 after 1 signal period.

The preferred algorithm will now be derived for a single channel anti-noise system for the conditions where both the primary process and the secondary process are linear.

The cancellation control signal $s(k)(k=1, 2, \ldots, n)$ can be written as:

$$s(k) = \overline{\phi}^H(k)\overline{\theta}_c(k-1) \tag{6}$$

wherein "$H$" indicates the transposition of the conjugate of the complex vector, $\overline{\phi}^H(k)$ is the vector which comprises the input values for the control unit 1 and $\overline{\theta}_c(K-1)$ is the vector which comprises the most recent filter coefficients of the control unit 1.

If it is assumed that the time-invariant secondary process can be modelled as a finite impulse response (FIR) with coefficients $h_j$, then the output signal $y_s(k)$ of the secondary process can be written as a convolution of the cancellation control signal $s(k)$ and the finite impulse response $h_j$:

$$y_s(k) = \sum_{j=0}^{J-1} h_j s(k-j) \tag{7}$$

For an ideal sensor 4: the measured error $\epsilon(k) = y_p(k) = y_s(k)$ so that for a time delay control unit the error $\epsilon(k)$ can be written as:

$$\epsilon(k) = y_p(k) + \sum_{j=0}^{J-1} h_j \sum_{i=0}^{I-1} \phi^*(k-j-i)\theta_{c,i}(k-j-1) \tag{8}$$

In this equation "*" denotes the complex conjugate of the vector concerned. For a Fourier control unit based on equation (5) the error $\epsilon(k)$ can be written as:

$$\epsilon(k) = y_p(k) + \sum_{j=0}^{J-1} h_j \sum_{v=1}^{N} \phi_v^*(k-j)\theta_{c,v}(k-j-1) \tag{9}$$

In order to simplify the estimation process, use is made of the abovementioned filtered-x configuration, which is known per se. In this context it is assumed that if the step size parameter $\gamma$ is chosen to be small, the change in the estimated filter coefficients is small over the length of the finite impulse response (over J samples). In other words, the following equation then applies:

$$\theta_{c,i}(k-1-j) \approx \theta_{c,i}(k-1) \text{ for } j=0, \ldots, J-1 \tag{10}$$

Based on equation (10), the error $\epsilon(k)$ can be written as:

$$\epsilon(k) = y_p(k) + \sum_{i=0}^{I-1} \theta_{c,i}(k-1) \sum_{j=0}^{J-1} h_j\phi^*(k-j-i) \tag{11}$$

when a time delay control unit is used and as:

$$\epsilon(k) = y_p(k) + \sum_{v=1}^{N} \theta_{c,v}(k-1) \sum_{j=0}^{J-1} h_j\phi_v^*(k-j) \tag{12}$$

when a Fourier control unit is used. Equations (11) and (12) can also be written in the following vector notation:

$$\epsilon(k) = y_p(k) + \overline{r}^H(k)\overline{\theta}_c(k-1) \tag{13}$$

in which the components of the vector $\overline{r}^H(k)$ are equal to the value defined in equation (14) in the case of a time delay control unit and are equal to the value defined in equation (15) in the case of a Fourier control unit:

$$r_i(k) = \sum_{j=0}^{J-1} h_j^* \phi(k-j-i) \quad (14)$$

$$r_v(k) = \sum_{j=0}^{J-1} h_j^* \phi_v(k-j) \quad (15)$$

The vector $\bar{r}^H(k)$ is termed the filtered-x signal.

If the secondary path is known, updating of the filter coefficients is reduced to a general linear control configuration if the step size parameters are small. If the projection algorithm, which is known per se, is now applied to the abovementioned filtered-x configuration, the following algorithm can be derived for updating of the filter coefficients:

$$\bar{\theta}_c(k) = \bar{\theta}_c(k-1) - \gamma \frac{\bar{r}(k)\epsilon(k)}{\alpha + \bar{r}^H(k)\bar{r}(k)} \quad (16)$$

where:

$\bar{\theta}_c(k)$ filter coefficient vector at "time" k $\gamma$=step size parameter $\alpha$=a small positive constant to prevent division by 0

Figure 2:
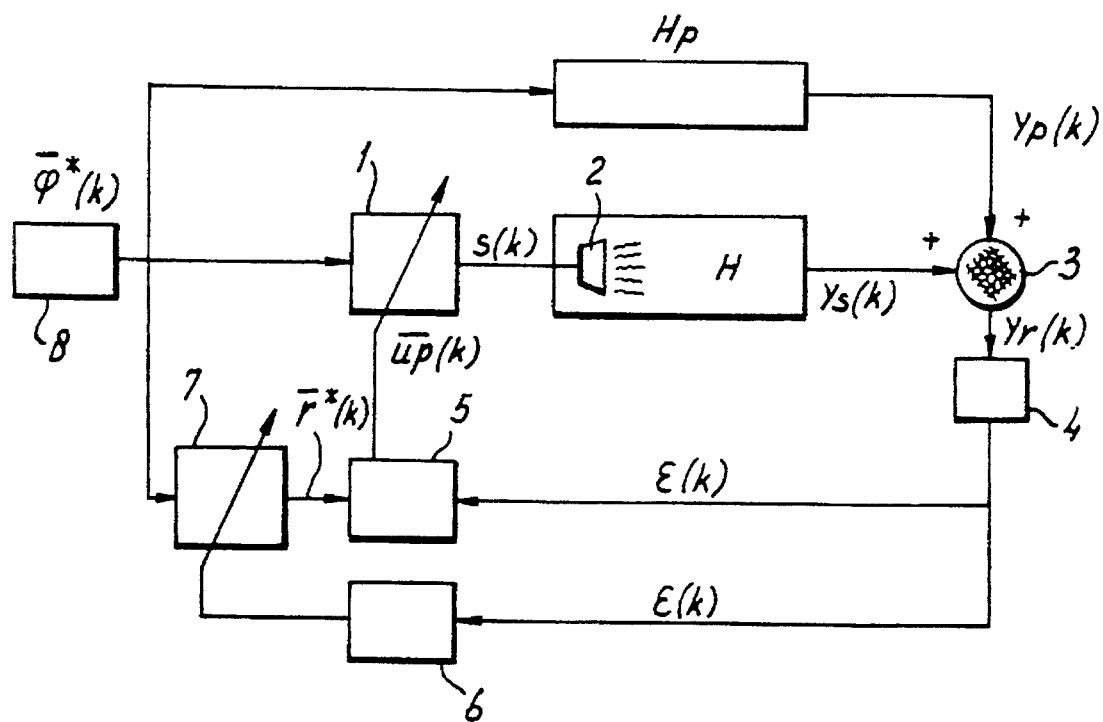
FIG. 2 shows an example of a block diagram of an anti-noise system according to the invention.

Updating of the filter coefficients with the aid of algorithm (16) can be implemented with the aid of the diagram shown in FIG. 2. In FIG. 2, elements which are the same as those in FIG. 1 are designated by the same reference numerals. Instead of a reference signal $\phi(k)$ reference is made directly to a reference signal vector $\bar{\phi}(k)$, as defined in either equation (3) or equation (5). Furthermore, instead of a single update signal up(k) an update vector $\overline{up}(k)$ is shown in which all update signals for all filter coefficients of the control unit 1 are incorporated. An adaptation unit 7 has been added between the reference signal $\phi^*(k)$ and the input of the update unit 5. The adaptation unit 7 adapts the reference signal $\phi^*(k)$ supplied to the update unit 5 in accordance with the processing of equation (14) or (15), depending on whether the reference signal is defined according to equation (3) or equation (5) respectively. The signal supplied to the update unit is the filtered-x signal $\bar{r}^*(k)$. On the basis of the filtered-x signal $\bar{r}^*(k)$ the update unit calculates an update signal $\overline{up}(k)$ in accordance with the following equation:

$$\overline{up}(k) = \gamma \frac{\bar{r}(k)\epsilon(k)}{\alpha + \bar{r}^H(k)\bar{r}(k)} \quad (16')$$

The normalised input correlation matrix in this filtered-x configuration is equal to (k=1, 2, ..., n):

$$\sum_{k=1}^{n} \frac{\bar{r}(k)\bar{r}^H(k)}{\bar{r}^H(k)\bar{r}(k)} \quad (17)$$

It is now found that the eigenvalue distribution of this autocorrelation matrix is still highly dependent on the input vectors. Optimisation is generally difficult for a time delay control unit. For a Fourier control unit, however, the matrix according to equation (17) can easily be optimised if the matrix were to be a diagonal matrix, that is to say if all elements of the matrix not lying on the diagonal were to be small with respect to the diagonal elements. This condition is met if two arbitrary components of the input vector are always independent. It is probable that for a Fourier control unit the elements of the matrix (17) not lying on the diagonal will have become negligibly small with respect to the diagonal elements after a few steps of the calculation, so that in this case the matrix (17) is a good approximation to a diagonal matrix. The eigenvalue distribution of the matrix (17) will then be substantially equal to 1 if the components $\psi_{c,v}(k)$ of the vector $\bar{\theta}_c(k)$ in the update algorithm according to equation (16) are scaled by the following factor:

$$\frac{r_v^*(k)r_v(k)}{\sum_{v=1}^{N} r_v^*(k)r_v(k)} \quad (18)$$

Use of equation (18) results in the following recursive relationship for the calculation of the filter coefficients $\theta_{c,v}(k)$:

$$\theta_{c,v}(k) = \theta_{c,v}(k-1) - \gamma \frac{r_v(k)\epsilon(k)}{(\alpha' + r_v^*(k)r_v(k))} \quad (19)$$

wherein: $\alpha'$ is a small constant to prevent division by 0.

In the case of implementation of the algorithm according to equation (19), the real component must be separated from the imaginary component. If only one filter coefficient $\theta_c(k)$ were to be calculated, algorithm (19) would be reduced to:

$$\begin{pmatrix} Re[\theta_c(k)] \\ Im[\theta_c(k)] \end{pmatrix} = \begin{pmatrix} Re[\theta_c(k-1)] \\ Im[\theta_c(k-1)] \end{pmatrix} - \gamma \frac{\begin{pmatrix} Re[r(k)] \\ Im[r(k)] \end{pmatrix} \epsilon(k)}{\alpha + Re\,[r(k)]^2 + Im\,[r(k)]^2} \quad (20)$$

In the case of multiple input signals algorithm (20) applies for each $\theta_{c,v}(k)$.

For multi-channel systems, that is to say systems in which diverse cancellation signal generators 2 and diverse sensors 4 are used, a similar algorithm can be derived for updating the filter coefficients in the control unit 1. For a multi-channel system, the following recursive relationship can be derived for the filter coefficients $\bar{\theta}_{c,v}(k)$:

$$\bar{\theta}_{c,v}(k) = \bar{\theta}_{c,v}(k-1) - \gamma [R_v(k)R_v^H(k)]^{-1} R_v(k)\bar{\epsilon}(k) \quad (21)$$

where:

$\bar{\theta}_{c,v}(k)$ is an L-dimensional filter coefficient vector when L cancellation signal generators 2 are present;

$\gamma$=step size parameter;

$R_v(k)$ is an L×M matrix which contains input signals $r_{v,l,m}(k)$ as elements when M sensors 4 are present;

$\bar{\epsilon}(k)$=error signal vector with M elements originating from the M sensors 4.

It can be demonstrated that the convergence speed is also optimum for the multi-channel algorithm according to equation (21) and is not dependent on the position of the various cancellation signal generators 2 and the various sensors 4.

In the above it has been assumed that the transfer function H of the secondary path is known and stationary. In reality, the secondary path is far from always being stationary, which means that the components $h_j$ of the transfer function H, as used in the adaptation unit 7, are not stationary. Means 6 for estimation of the transfer function at the time of updating of the filter coefficients can also be incorporated in the diagram. The estimating means 6 can be installed as shown in FIG. 2, that is to say connected by an input to the sensor 4 and by an output to the adaptation unit 7 for updating of the components $h_j$ of the transfer function H. Means of this type are known to those skilled in the art and do not require more detailed explanation here (see, for example, U.S. Pat. No. 4,878,188).

It will be clear to a person skilled in the art that the control unit 1, the update unit 5, the estimating unit 6 (if used) and the adaptation unit 7 can be implemented together in the software of a computer.

I claim:

1. A system for the generation of an estimated time variant signal for suppression of a primary signal, comprising:

means for generating at least one reference signal;
a control unit at least provided with a digital filter, a first input for receiving the reference signal, a second input for receiving an update signal for updating coefficients of the digital filter and an output for providing a cancellation control signal;
cancellation-generating means which are connected to the output of the control unit for the generation of a cancellation signal, which is intended, after propagation along a secondary transfer path having a secondary path transfer function, to be added as the estimated time variant signal at an addition point to the primary signal in order to provide a residual signal,
sensor means for measuring the residual signal at the addition point and for providing an error signal;
update means provided with an input which is connected to the sensor means and an output for providing the update signal,
wherein
the system also comprises an adaptation unit which has an input for receiving the at least one reference signal and an output for providing a filtered-x signal, which output is connected to a further input of the update means;
the adaptation unit has a transfer function which is the same as the transfer function of the secondary path;
means are provided for updating the filter coefficients with the aid of the so-called "projection algorithm" and
the means for generating the reference signal generate the reference signal in such way that an input correlation matrix defined as follows $$\sum_{k=1}^{n} \frac{\overline{r}(k)\overline{r^H}(k)}{\overline{r^H}(k)\overline{r}(k)}$$

has an eigenvalue distribution which has a value which is substantially equal to 1 after as few steps as possible, where
$k=1, 2, \ldots, n$, n having a predetermined value;
$\overline{r}(k)$ is a vector either having components $r_i(k)$ ($i=1, 2, \ldots, I$) definded as $$r_i(k) = \sum_{j=0}^{J-1} h_j^* \phi(k-j-i)$$

when said control unit is a time delay control unit or components $r_\nu(k)(\nu=1, 2, \ldots, I)$ defined as $$r_\nu(k) = \sum_{j=0}^{J-1} h_j^* \phi_\nu(k-j)$$

when said control unit is a fourier control unit;
$\overline{r^H}(k)$ is the transposition of the conjugate of $\overline{r}(k)$;
$h_j(k)$ is complex conjugate of $h_n(j=1, 2, \ldots)$ being the FIR coefficients of said secondary path transfer function;
$\phi(k-j-i)$ is series of input reference vectors in time domain forming said reference signal; and
$\phi_\nu(k-j)$ is series of input reference vectors in frequency domain forming said reference signal.

2. A system according to claim 1, wherein the cancellation-generating means include a predetermined number of L cancellation-generators and the sensor means include a predetermined number of M sensors, the control unit being provided with means for updating coefficients of the digital filter in accordance with the following recursive relationship:

$$\overline{\theta_{c,\nu}}(k) = \overline{\theta_{c,\nu}}(k-1)\gamma[R_\nu(k)R_\nu^H(k)]^{-1}R_\nu(k)\epsilon(k)$$

where:
$\overline{\theta_{c,\nu}}(k)$ is a vector including said coefficients of said digital filter and having L elements;
$\gamma$=step size parameter;
$R_\nu(k)$ is an LxM matrix which contains input signals $r_{\nu,l,m}(k)$ as elements when M sensors are present, in which $l=1, 2, \ldots, L$ and $m=1, 2, \ldots, M$;
$\epsilon(k)$=error signal vector with M elements originating from the M sensors.

3. A system according to claim 1, wherein
the means for generating the reference signal are equipped to generate the following reference signal:

$$\overline{\phi_f}(k) = [\phi_1(k)\phi_2(k) \ldots \phi_I(k)]^T$$

where:

$$\phi_\nu(k) = exp(j2\pi f_\nu k \Delta t)$$

$$\nu = 1, 2, \ldots, I$$

the update unit is provided with means for calculating the update signal as follows:

$$up_\nu(k) = \gamma \frac{r_\nu(k)\epsilon(k)}{(\alpha' + r_\nu^*(k)r_\nu(k))}$$

where:
$\gamma$=step size
$\epsilon(k)$=error signal from said sensor means;
$\alpha'$=small constant to prevent division by 0; and
the control unit is provided with means for calculating the filter coefficients $\theta_{c,\nu}(k)(\nu=1, 2, \ldots, I)$ as follows:

$$\theta_{c,\nu}(k) = \theta_{c,\nu}(k-1) - up_\nu(k).$$

4. A system according to claim 1, wherein the system also comprises estimating means for estimating the transfer function of the secondary path, said estimating means having an input connected to the sensor means and an output connected to the adaptation unit for transmitting an output signal for updating of the transfer function used in the adaptation unit.

5. A system according to claim 4, wherein the control unit, the update means, the estimating means and the adaptation unit are implemented together in the software of a computer.

6. A system according to claim 1, wherein the control unit, the update unit and the adaptation unit are implemented together in the software of a computer.

7. A system according to claim 1, wherein the cancellation-generating means are selected from the following means:
at least one loudspeaker, at least one vibration generator, at least one adjustable flow-induced noise source, and wherein the sensor means are selected from the following means:
at least one noise pressure sensor, at least one vibration recorder.

8. A system according to claim 1, wherein the system also comprises estimating means for estimating the transfer function of the secondary path, said estimating means having an input connected to the sensor means and an output connected to the adaptation unit for transmitting an output signal for updating of the transfer function used in the adaptation unit.

9. A system according to claim 1, wherein the control unit, the update means, the estimating means and the adaptation unit are implemented together in the software of a computer.

10. A system according to claim 1, wherein the control unit, the update unit and the adaptation unit are implemented together in the software of a computer.

11. A system according to claim 1, wherein the cancellation-generating means are selected from the following means:

at least one loudspeaker, at least one vibration generator, at least one adjustable flow-induced noise source, and wherein the sensor means are selected from the following means:

at least one noise pressure sensor, at least one vibration recorder.

* * * * *